United States Patent
Liu et al.

(10) Patent No.: US 11,871,533 B2
(45) Date of Patent: Jan. 9, 2024

(54) CARRIER UNIT FOR INSTALLING HARD DISK DRIVE, CARRIER ASSEMBLY HAVING THE SAME, AND SERVER HAVING THE SAME

(71) Applicant: Fulian Precision Electronics (Tianjin) Co., LTD., Tianjin (CN)

(72) Inventors: Ge Liu, TianJin (CN); Han-Yu Li, New Taipei (TW); Bin-Bin Yang, Tianjin (CN); Meng-Ya Cui, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/847,379

(22) Filed: Jun. 23, 2022

(65) Prior Publication Data

US 2023/0133801 A1 May 4, 2023

(30) Foreign Application Priority Data

Oct. 28, 2021 (CN) .......................... 202111266326.5

(51) Int. Cl.
*H05K 7/14* (2006.01)
*H05K 5/02* (2006.01)

(52) U.S. Cl.
CPC ........... *H05K 7/1487* (2013.01); *H05K 5/023* (2013.01); *H05K 5/0221* (2013.01); *H05K 5/0291* (2013.01); *H05K 7/1489* (2013.01)

(58) Field of Classification Search
CPC .... H05K 7/1487; H05K 5/0221; H05K 5/023; H05K 5/0291; H05K 7/1489; G11B 33/124; G11B 33/128
See application file for complete search history.

(56) References Cited

U.S. PATENT DOCUMENTS

| 6,625,014 | B1* | 9/2003 | Tucker | G06F 1/184 |
| | | | | 361/679.33 |
| 10,061,362 | B2* | 8/2018 | Jau | H05K 7/1487 |
| 2006/0171110 | A1* | 8/2006 | Li | G11B 33/128 |
| 2012/0087084 | A1* | 4/2012 | Nguyen | G06F 1/187 |
| | | | | 361/679.37 |
| 2015/0123519 | A1* | 5/2015 | Chen | G06F 1/187 |
| | | | | 312/223.2 |
| 2017/0202102 | A1* | 7/2017 | Della Fiora | H05K 5/0221 |
| 2021/0251098 | A1* | 8/2021 | Gao | G11B 33/128 |

FOREIGN PATENT DOCUMENTS

| CN | 104375595 A | * | 2/2015 | ............. G06F 1/187 |
| CN | 108594966 A | * | 9/2018 | ............. G06F 1/187 |

* cited by examiner

*Primary Examiner* — James Wu
*Assistant Examiner* — Christopher L Augustin
(74) *Attorney, Agent, or Firm* — ScienBiziP, P.C.

(57) ABSTRACT

A carrier assembly for installing a hard disk drive (HDD) rapidly without tools or screws or other fasteners disk includes a bracket and a carrier. The carrier is movably disposed within the bracket. The hard disk drive is disposed with the carrier. The bracket includes a side plate and a plurality of first protrusions arranged on the side plate along with electrical connectors. The side plate defines interconnecting slots, a vertical first slot and a horizontal second slot. The carrier includes a lateral plate, a rotating handle connected to the lateral plate, and second protrusions arranged on the lateral plate. When the rotating handle is manually rotated, the second protrusion becomes locked within the first slot or the second slot to fix the HDD in place.

17 Claims, 6 Drawing Sheets

CARRIER UNIT FOR INSTALLING HARD DISK DRIVE, CARRIER ASSEMBLY HAVING THE SAME, AND SERVER HAVING THE SAME

FIELD

The subject matter herein generally relates to server construction, and more particularly, to a carrier unit for installing hard disk drive, and a carrier assembly having the carrier unit, and a server having the carrier assembly.

BACKGROUND

Hard disk drives (HDDs) are commonly utilized to store relatively large amounts of data in today's server systems.

Installing the HDDs to a server often requires fasteners, such as screws, which causes a low installation efficiency.

BRIEF DESCRIPTION OF THE DRAWINGS

Implementations of the present technology will now be described, by way of example only, with reference to the attached figures.

DETAILED DESCRIPTION

Figure 1:
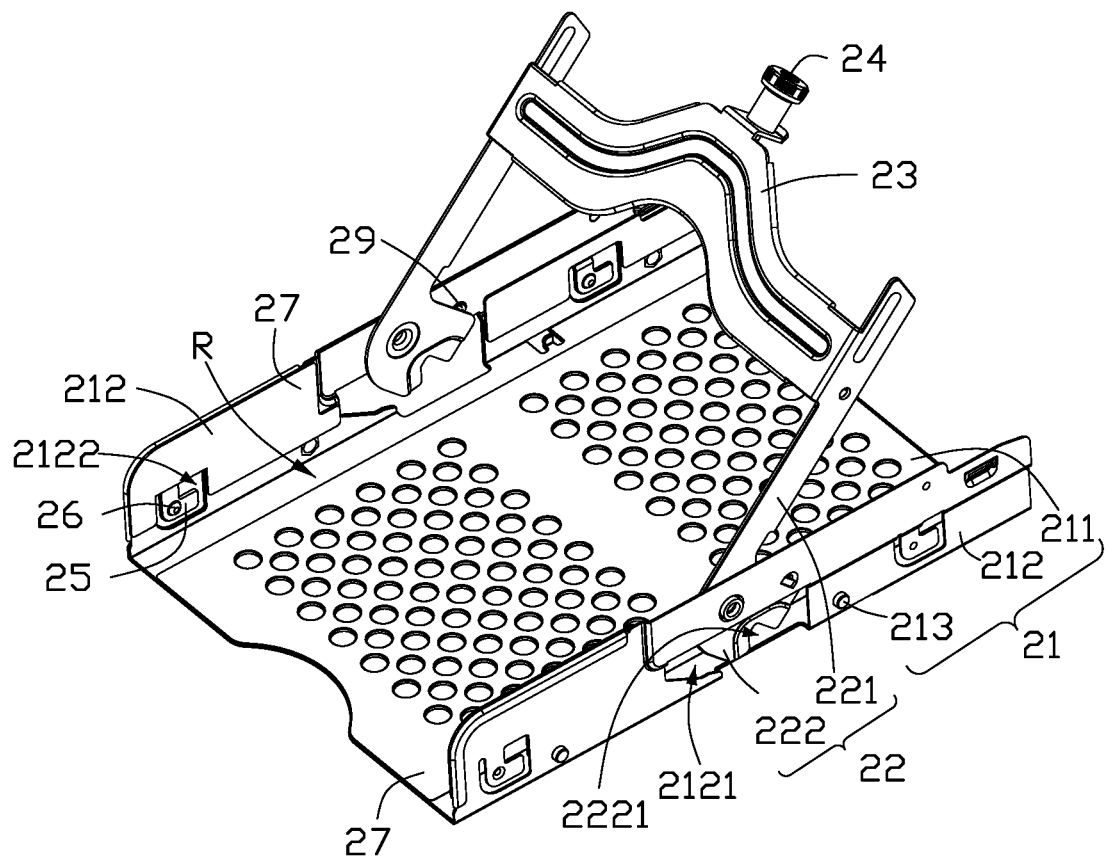
FIG. 1 is a diagrammatic view of a carrier unit according to an embodiment of the present disclosure.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
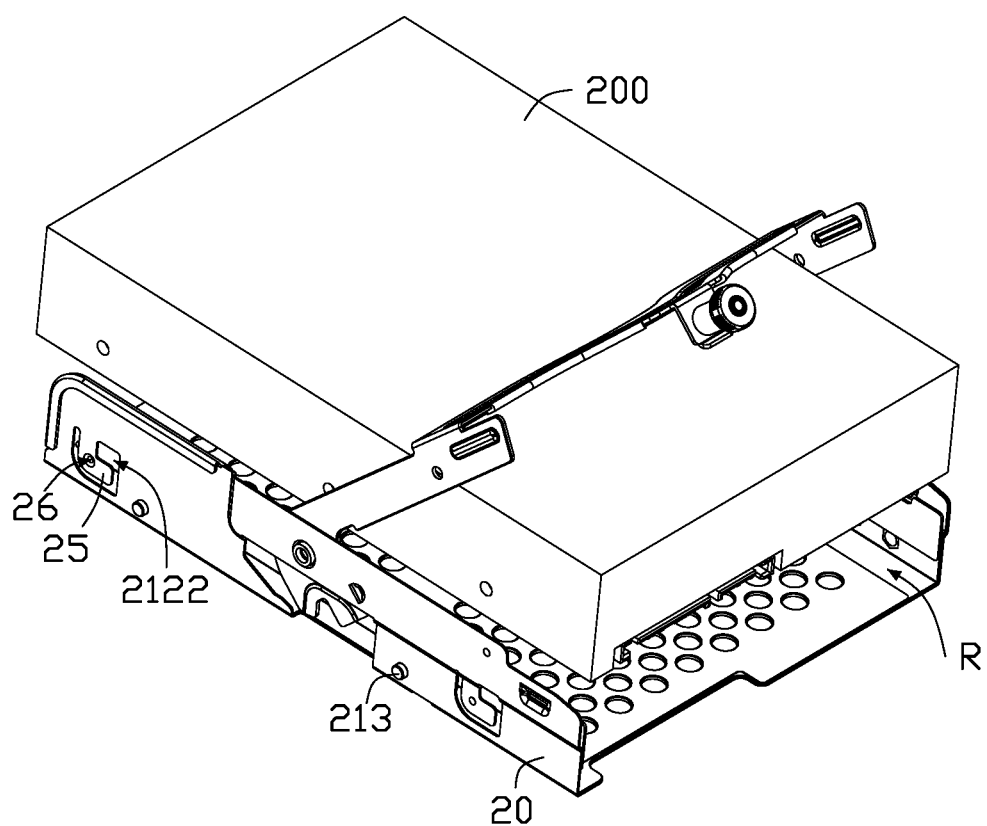
FIG. 2 is a diagrammatic view of the carrier unit of FIG. 1, accommodating an HDD.
Figure 3:
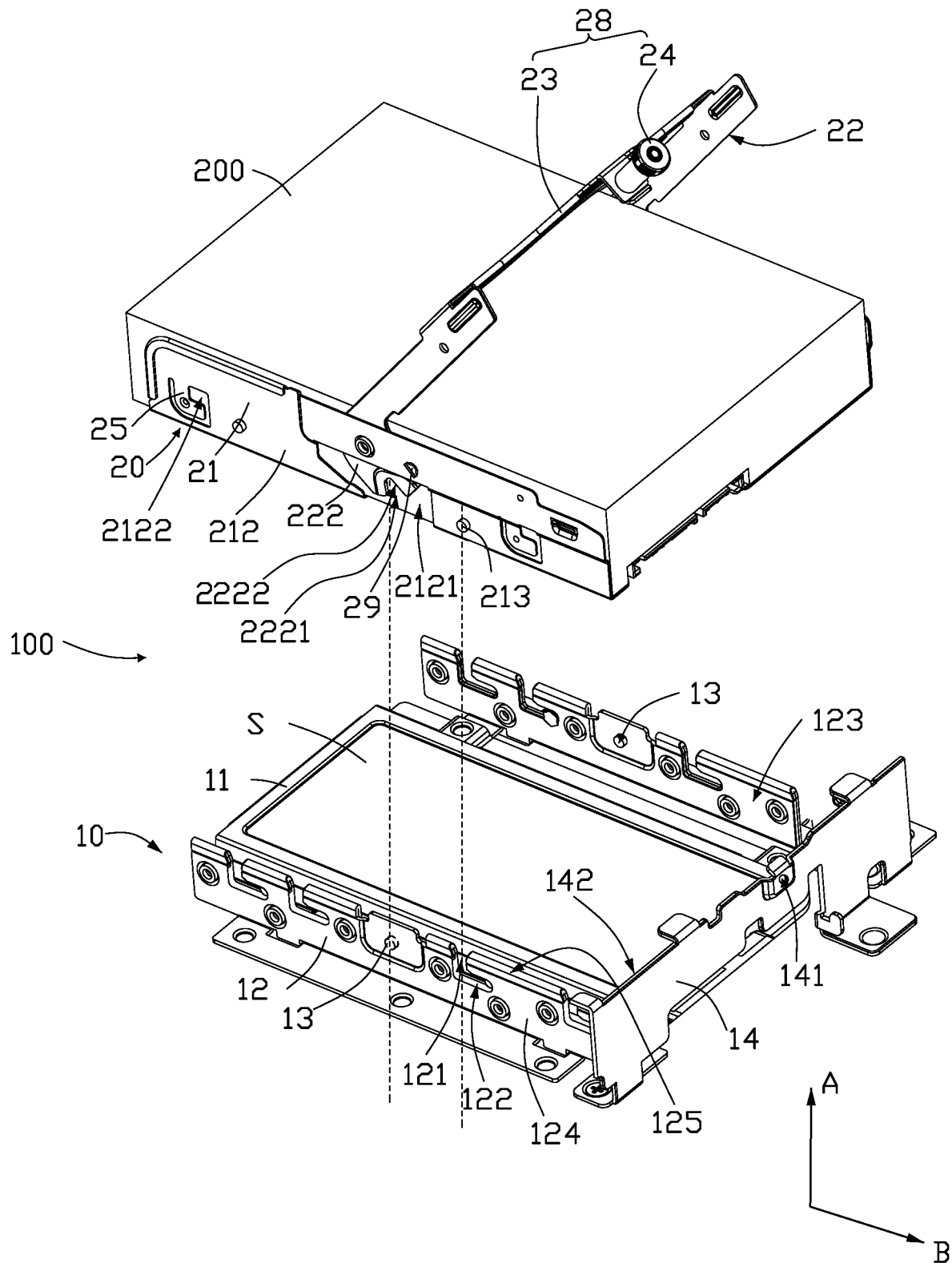
FIG. 3 is a diagrammatic view of a carrier unit of FIG. 1 showing a bracket.

Referring to FIGS. 2 and 3, an embodiment of an HDD carrier unit 100 is provided. The carrier unit 100 includes a bracket 10 and a carrier 20. The bracket 10 defines a receiving spaces S. The carrier 20 is removably inserted into the receiving spaces 10. The carrier 20 is used for carrying an HDD 200.

Referring to FIG. 3, the bracket 10 includes a base plate 11, two side plates 12, a plurality of first protrusions 13, and an end plates 14. The two side plates 12 are connected to the base plate 11, the two side plates 12 are side by side but spaced from each other. The end plate 14 is connected to the base plate 11 and the two side plates 12 to cooperatively define the receiving space S. The first protrusions 13 are disposed on each of the two side plates 12, the first protrusions 13 extend into the receiving space S. Each of the two side plates 12 defines a first slot 121 and a second slot 122 communicating with to the first slot 121. The first slot 121 and the second slot 122 extend in different directions. In this embodiment, the first slot 121 is vertical, the second slot 122 is horizontal.

In this embodiment, the two side plates 12 are rectangular in shape. A first direction A is defined as the width direction of the side plate 12, and a second direction B is defined as the length direction of the side plate 12. The first slot 121 extends along the first direction A. The second slot 122 extends along the second direction B.

Referring to FIGS. 1 and 2, the carrier 20 includes a base body 21, a rotating handle 22, and a latching mechanism 28 (referring to FIG. 3). The rotating handle 22 is rotatably connected to the base body 21. The latching mechanism 28 is connected to the rotating handle 22. The rotating handle 22 acts to engage the base body 21 with the bracket 10, and the latching mechanism 28 fixes the base body 21 to the bracket 10.

The base body 21 includes a bottom plate 211, two lateral plates 212, and a plurality of second protrusions 213. The two lateral plates 212 are connected to the bottom plate 211, the two lateral plates 212 and the bottom plate 211 cooperatively define a receiving groove R for accommodating the HDD 200. The second protrusions 213 are disposed on a surface of the lateral plate 212 facing away from the receiving groove R. A portion of the second protrusion 213 is engaged with either the first slot 121 or the second slot 122. Thereby, the base body 21 is connected to the bracket 10.

The rotating handle 22 include two rotating arms 221 and a push plate 222. Each push plate 222 is connected to an end of a rotating arm 221. The rotating arm 221 is rotatably connected to the lateral plate 212. The rotating arm 221 drives the push plate 222 to rotate around a third direction C, the direction C is perpendicular to the first direction A and the second direction B. The push plate 222 resists against the first protrusion 13. Thus, the push plate 22 drives the second protrusion 213 to alternatively engage with the first slot 121 or the second slot 122.

The latching mechanism 28 includes a pressing bar 23 and a plunger 24 connected to the pressing bar 23. The pressing bar 23 is located between the two rotating arms 221. The ends of the pressing bar 23 are connected to the ends of the two rotating arms 221. The end plate 14 defines a fixing hole 141. A portion of the plunger 24 can extend into the fixing hole 141, making the connection between the bracket 10 and the carrier 20 more stable. The plunger 24 is elastic.

In the present disclosure, the carrier unit 100 is provided with the carrier 20. The carrier 20 defines the second protrusion 213 and the push plate 222, and the bracket 10 defines the first slot 121, the second slot 122 and the first protrusion 13. The push plate 222 resists against the first protrusion 13. The second protrusion 213 is located inside the first slot 121 or the second slot 122. The first slot 121 and the second slot 122 extend in different directions. Thus, when the second protrusion 213 is located inside the first slot 121, the carrier 20 can be removed from the bracket 10, and when the second protrusion 213 is located inside the second slot 122, the carrier 20 is engaged with the bracket 10. Unlike conventional art, the carrier unit 100 does not need to use screws, and a quick assembly or disassembly of the HDD 200 can be achieved by simply rotating the rotating arm 221. The carrier unit 100 is of low cost, requires no tools or power-assisted structure, is simple to operate, and occupies a small space, it is also versatile.

Referring to FIG. 3, in this embodiment, the bracket 10 further includes a circuit board 142. The circuit board 142 is connected to the end plate 14. The circuit board 142 faces the receiving space S. When the carrier 20 installed with the HDD 200 is disposed within the receiving space S, the HDD 200 can electrically connect to the circuit board 142. Particularly, the circuit board 142 defines a male connector (not shown), the HDD 200 defines a female connector (not shown). The male connector can meet the female connector to achieve an electrical connection between the circuit board 142 and the HDD 200. The male connector can be golden fingers, the female connector can be a card slot. In other embodiments, the circuit board 142 and the HDD 200 can be connected through a USB (Universal Serial Bus) connection.

Referring to FIG. 3, in this embodiment, the side plate 12 includes an inner surface 123, an outer surface 124, and a connecting surface 125. The inner surface 123 and the outer surface 124 are opposite surfaces of the side plate 12. The connecting surface 125 connects the inner surface 123 and the outer surface 124. The inner surface 123 faces the receiving space S. The first slot 121 penetrates through the inner surface 123, the outer surface 124, and the connecting surface 125. The second slot 122 penetrates through the inner surface 123 and the outer surface 124.

Referring to FIG. 1, in this embodiment, the lateral plate 212 defines a first opening 2121. The rotating arm 221 is connected to a surface of the lateral plate 212 that faces the receiving groove R. The push plate 222 is exposed to the first opening 2121. Thus, the first protrusion 13 can pass through the first opening 2121 and resist against the push plate 222.

Referring to FIGS. 1 and 3, in this embodiment, the push plate 222 defines a gap 2221. A portion of the first protrusion 13 is disposed within the gap 2221. The gap 2221 defines an arc-shaped resisting surface 2222, a center point of the resisting surface 2222 is offset in the third direction C. Thus, as the push plate 222 rotates around the third direction C, the resisting surface 222 resists against the first protrusion 13, and pushes the second protrusion 213 to move from the first slot 121 to the second slot 122.

In this embodiment, the carrier 20 further includes an embossment 29. The embossment 29 is disposed on a surface of the lateral plate 212 that faces the receiving groove R. The embossment 29 is used for stopping any further rotation of the push plate 222 as well as defining the maximum rotational angle of the rotating arm 221.

Referring to FIGS. 1 and 2, in this embodiment, the carrier 20 further includes an elastic member 25 and a protrusion 26. The protrusion 26 is disposed on the elastic member 25. The lateral plate 212 further defines a second opening 2122 that communicates with the receiving groove R. The elastic member 25 is disposed in the second opening 2122, and the protrusion 26 extends into the receiving groove R. The protrusion 26 resists against the HDD 200, the elastic member 25 provides a constant block and resistance against the HDD 200.

Referring to FIG. 1, in this embodiment, the carrier 20 further includes a cushion 27. The cushion 27 is disposed on the lateral plate 212 or the bottom plate 211. The cushion 27 faces the receiving groove R. The cushion 27 reduces jarring or impact of the HDD 200 and the lateral plate 212 or the bottom plate 211, and reduces vibration to ensure smooth and stable operation of the HDD 200.

Figure 4:
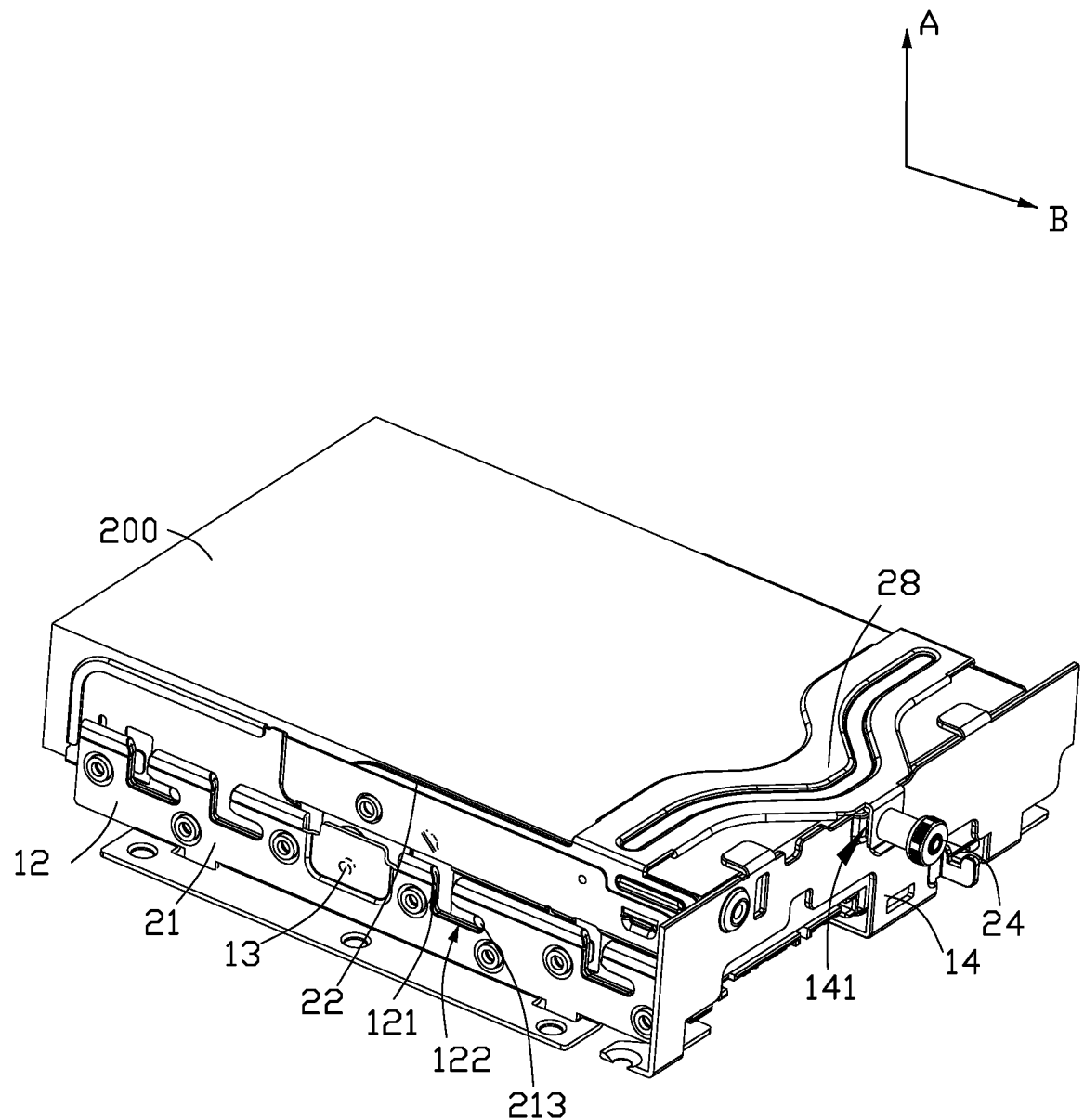
FIG. 4 is a diagrammatic view of the carrier unit according to an embodiment of present disclosure.

Referring to FIGS. 1 and 4, a procedure of installing the HDD 200 to the carrier unit 100 includes:

S1, referring to FIG. 1, pulling the rotating arm 221 up to its maximum angle until the embossment 29 hits the push plate 222.

S2, referring to FIG. 2, aligning the HDD 200 on top of the carrier 20 and putting the HDD 200 into the receiving groove R. Referring to FIGS. 2 and 3, when the HDD 200 is completely within the receiving groove R, the protrusion 26 will resist the HDD 200, and the HDD 200 will make contact with the cushion 27.

S3: referring to FIGS. 3 and 4, aligning the carrier 20 on top of the bracket 10, and putting the carrier 20 into the receiving space S. Referring to FIG. 4, when the HDD 200 is completely within the receiving space S, the second protrusion 213 will fall into the bottom of the first slot 121.

S4, referring to FIGS. 3 and 4, pressing down the rotating arm 221, the push plate 222 is resisted by the first protrusion 13, and the second protrusion 213 is pushed to move from the first slot 121 to the second slot 122 along the second direction B. When the rotating arm 221 is lowered to be parallel to the lateral plate 212, the pressing bar 23 will press against top of the HDD 200 to further fasten the HDD 200. Meanwhile, the plunger 24 will enter the fixing hole 141 to lock the HDD 200 and finish the installation process.

Accordingly, a procedure of removing the HDD 200 from the carrier unit 100 includes:

S5, referring to FIG. 3, disengaging the carrier 20 by pulling the plunger 24 out from the fixing hole 141.

S6, referring to FIG. 3, pulling up the rotating arm 221, and the push plate 222 resists against the first protrusion 13, and the second protrusion 213 is moved from the second slot 122 to the first slot 121.

S7, referring to FIG. 2, the carrier 20 can be taken out from the bracket 10, and the HDD 200 taken out from the carrier 20 along the first direction A.

Figure 5:
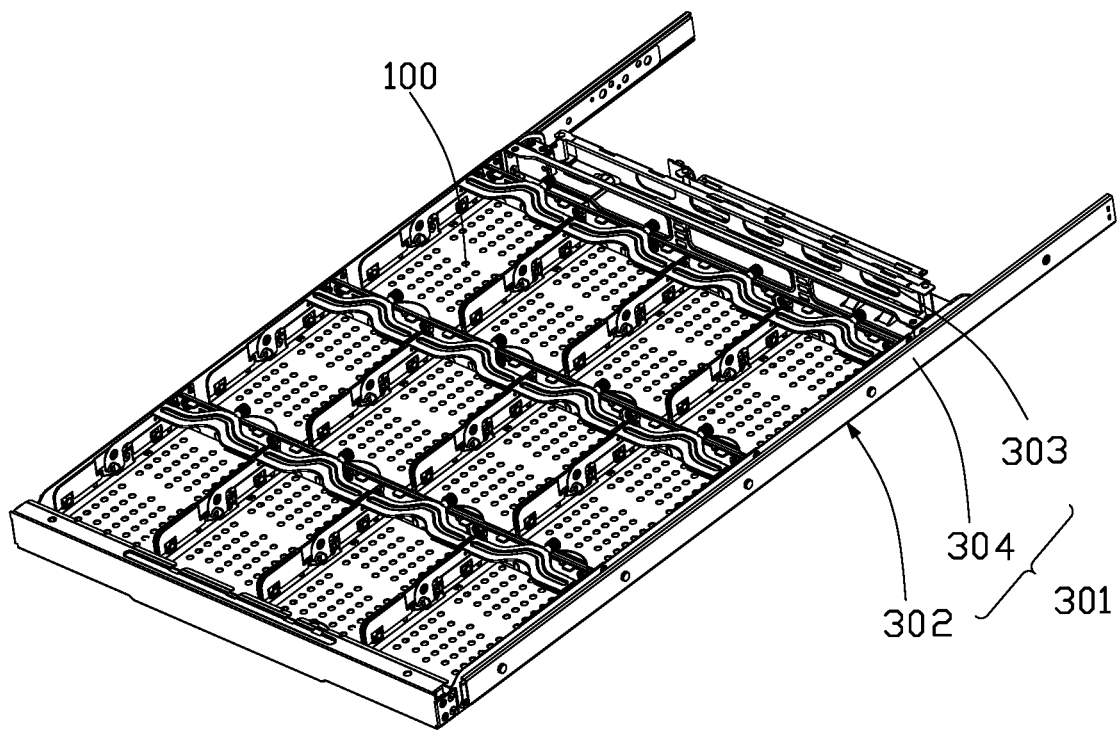
FIG. 5 is a diagrammatic view of a carrier assembly according to another embodiment of the present disclosure.

Referring to FIG. 5, an embodiment of a carrier assembly 300 is provided. The carrier assembly 300 includes a chassis 301 and a plurality of carrier units 100 arranged side-by-side on the chassis 301. The chassis 301 includes a support plate 302, a wire distributor 303, and a sliding member 304. The plurality of carrier units 100 is disposed side-by-side on the support plate 302. The sliding member 303 is arranged on an edge of the support plate 302 for facilitating a sliding movement of the carrier assembly 200 inside a server rack 402. The wire distributor 302 is movably arranged to the sliding member 303, the wire distributor 302 is electronically connected to each of the plurality of the carrier units 100.

Figure 6:
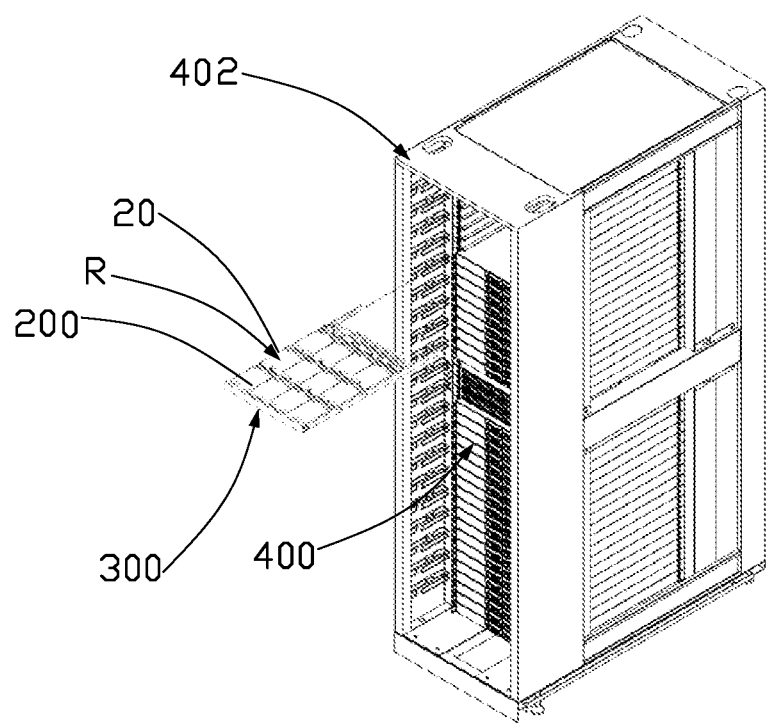
FIG. 6 is a diagrammatic view of a server rack and a server according to an embodiment of the present disclosure.

Referring to FIG. 6, an embodiment of a server 400 is provided. The server 400 includes the carrier assembly 300 and the plurality of HDDs 200, each HDD is disposed within the receiving space R of each carrier 20.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A carrier unit for installing a hard disk drive, comprising:
   a bracket, defining a receiving space; and
   a carrier movably disposed within the receiving space;
   wherein the bracket comprises a base plate, a side plate, and a plurality of first protrusions, the side plate is connected to the base plate to cooperatively define the receiving space, the plurality of first protrusions is arranged on a surface of the side plate that faces the receiving space, the side plate defines a first slot and a second slot communicating with to the first slot, the first slot and the second slot extend in different directions;
   the carrier comprises a base body and a rotating handle, the base body comprises a bottom plate, a lateral plate, and a plurality of second protrusions, the lateral plate is connected to the bottom plate to cooperatively define a receiving groove used for accommodating the hard disk drive, the plurality of second protrusions is arranged on a surface of the lateral plate that faces away from the receiving groove, the plurality of second protrusions is engaged with the first slot or the second slot;
   the rotating handle comprises a rotating arm and a push plate connected to an end of the rotating arm, the rotating arm is rotatably connected to the lateral plate, the push plate resist with the plurality of first protrusions to drive the lateral plate to move relative to the side plate;
   the carrier further comprises a latching mechanism connected to another end of the rotating arm, the latching mechanism comprises a pressing bar and a plunger connected to the pressing bar, the bracket further comprises an end plate connected to the side plate and the base plate, the end plate defines a fixing hole, a portion of the plunger enter into the fixing hole.

2. The carrier unit of claim 1, wherein the bracket further includes a circuit board, the circuit board is connected to the end plate, the circuit board faces the receiving space, the circuit board is used for electronically connecting the hard disk drive.

3. The carrier unit of claim 1, wherein the lateral plate defines a first opening, the rotating arm is connected to a surface of the lateral plate faces the receiving groove, the push plate and the plurality of the first protrusions is exposed to the first opening.

4. The carrier unit of claim 3, wherein the push plate defines an arc-shaped resist surface, the plurality of first protrusions resists with the resist surface.

5. The carrier unit of claim 1, wherein the carrier further comprises an elastic member and a protrusion, the lateral plate further defines a second opening, the elastic member is fixed inside the second opening, the protrusion is disposed on a surface of the elastic member faces the receiving groove.

6. The carrier unit of claim 1, wherein the carrier further comprises a cushion, the cushion is disposed on a surface of the lateral plate or of the bottom plate that faces the receiving groove.

7. The carrier unit of claim 1, wherein the carrier further includes an embossing, the embossing is disposed on a surface of the lateral plate that faces the receiving groove, the embossing is used for stopping the push plate.

8. A carrier assembly for storing a plurality of hard disk drives, comprising:
   a chassis; and
   a plurality of carrier units arranged side-by-side on the chassis;
   wherein each of the plurality of carrier units comprises a bracket defining a receiving space, and a carrier movably disposed within the receiving space;
   the bracket comprises a base plate, a side plate, and a plurality of first protrusions, the side plate is connected to the base plate to cooperatively define the receiving space, the plurality of first protrusions is arranged on a surface of the side plate that faces the receiving space, the side plate defines a first slot and a second slot connected to the first slot, the first slot and the second slot extend in different directions;
   the carrier comprises a base body and a rotating handle, the base body comprises a bottom plate, a lateral plate, and a plurality of second protrusions, the lateral plate is connected to the bottom plate to cooperatively define a receiving groove used for accommodating a hard disk drive, the plurality of second protrusions is arranged on a surface of the lateral plate that faces the receiving groove, the plurality of second protrusions is engaged with the first slot or the second slot;
   the rotating handle comprises a rotating arm and a push plate that connected to an end of the rotating arm, the rotating arm is rotatably connected to the lateral plate, the push plate resist with the plurality of first protrusions to drive the lateral plate to move relative to the side plate;
   the carrier further comprises a latching mechanism connected to another end of the rotating arm, the latching mechanism comprises a pressing bar and a plunger connected to the pressing bar; the bracket further comprises an end plate connected to the side plate and the base plate, the end plate defines a fixing hole, portion of the plunger enter into the fixing hole.

9. The carrier assembly of claim 8, wherein the chassis comprises a support plate and a sliding member, the plurality of carrier units is disposed side-by-side on the support plate, the sliding member is arranged to an edge of the support plate.

10. The carrier assembly of claim 9, wherein the chassis further comprises a wire distributor movably arranged to the sliding member, the wire distributor is electronically connected to each of the plurality of the carrier units.

11. The carrier assembly of claim 8, wherein the bracket further includes a circuit board, the circuit board is connected to the end plate, the circuit board faces the receiving space, the circuit board is used for electronically connecting the hard disk drive.

12. The carrier assembly of claim 8, wherein the lateral plate defines a first opening, the rotating arm is connected to a surface of the lateral plate faces the receiving groove, the push plate and the plurality of the first protrusions is exposed to the first opening.

13. The carrier assembly of claim 8, wherein the push plate defines an arc-shaped resist surface, the plurality of first protrusions resists with the resist surface.

14. The carrier assembly of claim 8, wherein the carrier further comprises an elastic member and a protrusion, the lateral plate further defines a second opening, the elastic member is fixed inside the second opening, the protrusion is disposed on a surface of the elastic member faces the receiving groove.

15. The carrier assembly of claim 8, wherein the carrier further comprises a cushion, the cushion is disposed on a surface of the lateral plate or of the bottom plate that faces the receiving groove.

16. The carrier assembly of claim 8, wherein the carrier further includes an embossing, the embossing is disposed on a surface of the lateral plate that faces the receiving groove, the embossing is used for stopping the push plate.

17. A server, comprising:
- a carrier assembly;
- a plurality of hard disk drives disposed with the carrier assembly;
- wherein the carrier assembly comprises a chassis defining a plurality of receiving spaces, and a plurality of carriers detachably disposed within the plurality of the receiving space;
- the chassis comprises a base plate, a plurality of side plates, and a plurality of first protrusions, the plurality of side plates is connected to the base plate to cooperatively define the plurality of receiving spaces, each of the plurality of first protrusions is arranged on a surface of each of the plurality of the side plates that faces the receiving space, each of the plurality of the side plates defines a first slot and a second slot connected to the first slot, the first slot and the second slot extend in different direction;
- each of the plurality of carriers comprises a base body and a rotating handle, the base body comprises a bottom plate, a lateral plate, and a plurality of second protrusions, the lateral plate is connected to the bottom plate to cooperatively define a receiving groove, the plurality of hard disk drives is disposed within the receiving groove, the plurality of second protrusions is arranged on a surface of the lateral plate that faces the receiving groove, the plurality of second protrusions is engaged with the first slot or the second slot;
- the rotating handle comprises a rotating arm and a push plate that connected to an end of the rotating arm, the rotating arm is rotatably connected to the lateral plate, the push plate resist with the plurality of first protrusions to drive the lateral plate to move in relative to the side plate;
- the carrier further comprises a latching mechanism connected to another end of the rotating arm, the latching mechanism comprises a pressing bar and a plunger connected to the pressing bar;
- the bracket further comprises an end plate connected to the side plate and the base plate, the end plate defines a fixing hole, portion of the plunger entry the fixing hole.

* * * * *